United States Patent [19]

Koike et al.

[11] 4,277,799
[45] Jul. 7, 1981

[54] COLOR SOLID-STATE IMAGING DEVICE

[75] Inventors: Norio Koike, Tokyo; Iwao Takemoto, Kodaira; Masaharu Kubo, Hachioji; Kazuhiro Sato, Tokyo; Shusaku Nagahara, Hachioji, all of Japan

[73] Assignee: Hitachi, Ltd., Tokyo, Japan

[21] Appl. No.: 923,982

[22] Filed: Jul. 12, 1978

[30] Foreign Application Priority Data

Jul. 13, 1977 [JP] Japan .................. 52-82965

[51] Int. Cl.³ .......................................... H04N 9/07
[52] U.S. Cl. .................................................. 358/44
[58] Field of Search ........................ 358/41, 43–48, 358/50, 213

[56] References Cited

U.S. PATENT DOCUMENTS

| 3,971,065 | 7/1976 | Bayer | 358/41 |
| 4,067,046 | 1/1978 | Nakatani et al. | 358/213 |
| 4,117,510 | 9/1978 | Ohta et al. | 358/44 |
| 4,141,037 | 2/1979 | Nishimura et al. | 358/44 |

Primary Examiner—Bernard Konick
Assistant Examiner—Aristotelis M. Psitos
Attorney, Agent, or Firm—Craig & Antonelli

[57] ABSTRACT

A color solid-state imaging device is provided with a plurality of signal output lines for reading out signals derived from photoelectric conversion elements which form picture elements for red, green, and blue lights arranged in, for example, a checkered pattern.

12 Claims, 8 Drawing Figures

FIG. I
PRIOR ART

COLOR SOLID-STATE IMAGING DEVICE

BACKGROUND OF THE INVENTION

The present invention relates to a color solid-state imaging device in which a large number of photoelectric conversion elements for the three primary colors (red, green, and blue) and scanning circuits for deriving optical information from the respective elements are integrated on a semiconductor substrate.

A solid-state imaging device requires an imaging plate which has a resolution power equivalent to that of a pickup tube used in television broadcast equipment. Therefore, such a device needs photoelectric conversion elements which constitute a matrix of about 500×500 picture elements, switches for selecting (x,y) coordinates which correspond to the picture elements, an x (horizontal) scanning circuit, and a y (vertical) scanning circuit which turn the switches "on" and "off" and each of which consists of about 500 stages.

Accordingly, the solid-state imaging device ordinarily has a configuration as shown in FIG. 1. It is fabricated in accordance with MOS (metal-oxide-semiconductor) LSI (Large Scale Integration) circuit technology which can provide a high density of integration comparatively easily. Referring to FIG. 1, numeral 1 designates a horizontal scanning circuit for selecting x positions, while numeral 2 indicates a vertical scanning circuit for selecting y positions on the matrix. Numeral 3 represents a vertical switch MOS transistor (hereinbelow, simply termed "vertical switch") which is turned "on" or "off" by a scanning pulse from the circuit 2, numeral 4 a photodiode (photoelectric conversion element) which exploits the source junction of the vertical switch 3, and numeral 5 a vertical signal output line to which the drains of the vertical switches 3 are connected in common. Shown at 6 is a horizontal switch MOS transistor (hereinbelow, simply termed "horizontal switch") which is turned "on" or "off" by a scanning pulse from the horizontal scanning circuit 1, the drain of which is connected to a horizontal signal output line 7 and the source of which is connected to the vertical signal output line 5. Numeral 8 designates a photoelectric conversion element-biasing power source (usually called a "target power supply") which is connected to the horizontal signal output line 7 through a resistor 9. A common feature of solid-state imaging plates is that, since the individual picture elements are separate and scanning is executed by clock pulses externally impressed, the picture element whose signal is being read out can be readily discriminated. The solid-state imaging device is, accordingly, very convenient for obtaining color signals since the clock pulse serves as an index signal and because signals can be separated for the respective picture elements.

In the case of constructing a color television camera by the use of the solid-state imaging device in FIG. 1, three imaging plates for respectively converting lights of red (R), green (G), and blue (B) into electric signals are generally required. A color television camera employing the three solid-state imaging plates, however, needs a color resolving optical system for resolving image light into the three elementary colors of R, G, and B, a special imaging lens, etc. This forms a serious hindrance to the miniaturization of the camera and the reduction of its cost.

In view of this problem, a method has been proposed wherein, as illustrated by way of example in FIG. 2, the photoelectric conversion elements constituting a matrix of imaging picture elements are caused to correspond with color filters R, G, and B which transmit only red light, green light, and blue light respectively and which are arranged in a checkered pattern, whereby the three elementary color signals are derived from the single imaging plate (refer to the Official Gazette of Japanese Laid-Open Patent Application No. 51-112228). The expression "checkered pattern" signifies a pattern in which a plurality of color filters R, G, and B are arranged respectively periodically in the vertical and horizontal directions. The pitch of the array is not restricted to that illustrated in FIG. 2. In the construction shown in FIG. 2, the filters for green (or filters which transmit brilliance signals) are arranged horizontally and vertically on the imaging plate in a manner to fill up the interstices among the color filters of R and B. Therefore, even where the number of picture elements of the solid-state imaging plate is small, a color solid-state imaging device whose resolution is only slightly degraded can be provided. The method is very excellent for a system in which color signals are derived from a single solid-state imaging plate.

In principle, a color imaging device can be realized by combining the solid-state imaging device as shown in FIG. 1 and the color filters arranged in the checkered pattern as shown in FIG. 2. By this simple combination, however, the required demodulator becomes complicated, the processing of signal outputs is difficult and the expected high resolution cannot be attained.

Although, in FIG. 1, the principal construction is illustrated in order to explain the operation of the solid-state imaging device, in practice an interlaced scanning is required in the vertical direction in conformity with the display system of a pickup tube device. Moreover, for the purpose of preventing a capacitance lag (charges left unread), it is necessary to adopt an interlacing system in which two rows of picture elements are simultaneously selected (refer to the Official Gazette of Japanese Laid-Open Patent Application No. 51-57123). In the case of simultaneously selecting two rows of picture elements, by merely improving the vertical scanning and driving method of the solid-state imaging device shown in FIG. 1 (refer to the specification of Japanese Patent Application No. 51-71142), the color signals of the system employing the color filters shown in FIG. 2 cannot be read out in a manner to be separated for the respective picture elements. The reason therefor is that the signals of the two rows of picture elements simultaneously selected by the interlacing are delivered to the vertical signal output line 5 at the same time, so that both the signals mix with each other.

SUMMARY OF THE INVENTION

The present invention has been made in view of the above drawbacks, and has for an object a system which provides a color solid-state imaging device in which color signals respectively separated in time are obtained from picture elements for the colors red, green, and blue and which can be subjected to an interlacing scheme that obviates capacitive lag without lowering the resolution.

In order to accomplish such an object, the present invention consists concretely of a plurality of signal output lines for reading out signals of picture elements and in which signals from the picture elements for red, green, and blue are distributed to the plurality of signal output lines and then derived as outputs.

DETAILED DESCRIPTION OF THE INVENTION

Figure 1:
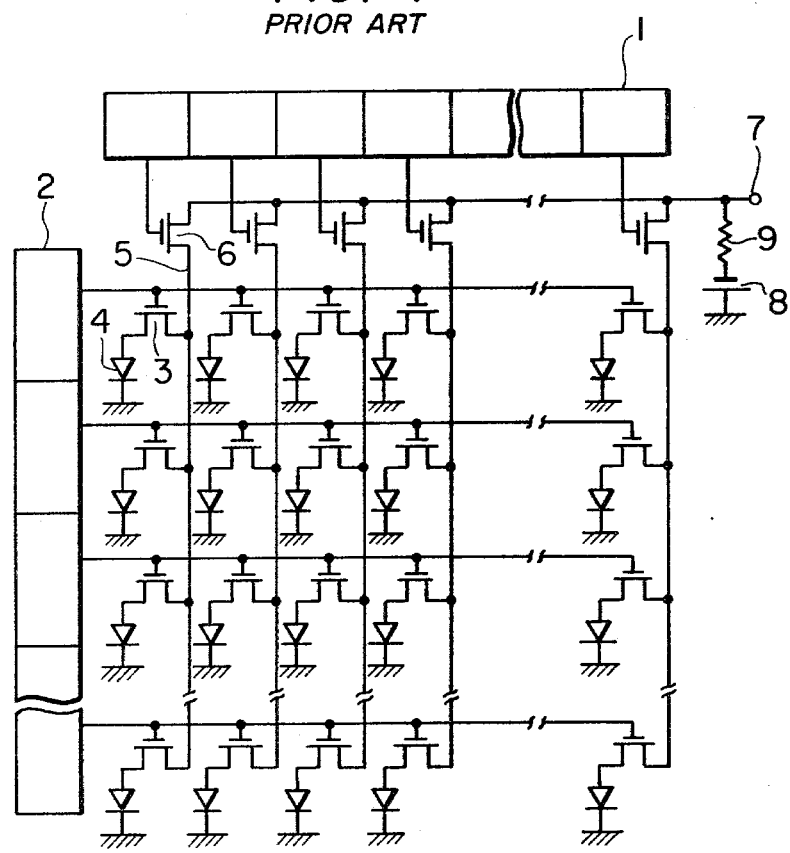
FIG. 1 is a circuit diagram showing the construction of a prior art solid-state imaging device.
Figure 2:
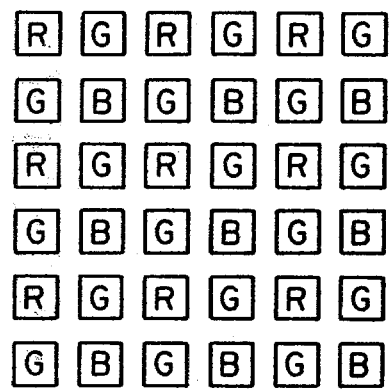
FIG. 2 is a schematic plan view showing the construction of a prior art color filter assembly.
Figure 7:
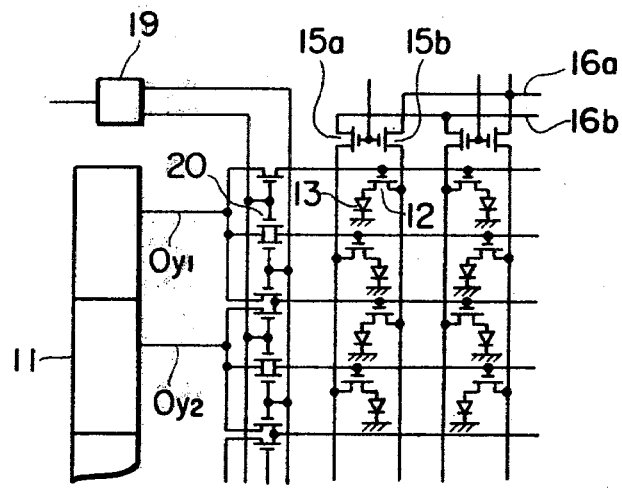
FIG. 7 is a circuit diagram showing an example of the concrete construction of a switching portion in the color solid-state imaging device of the invention.
Figure 3:
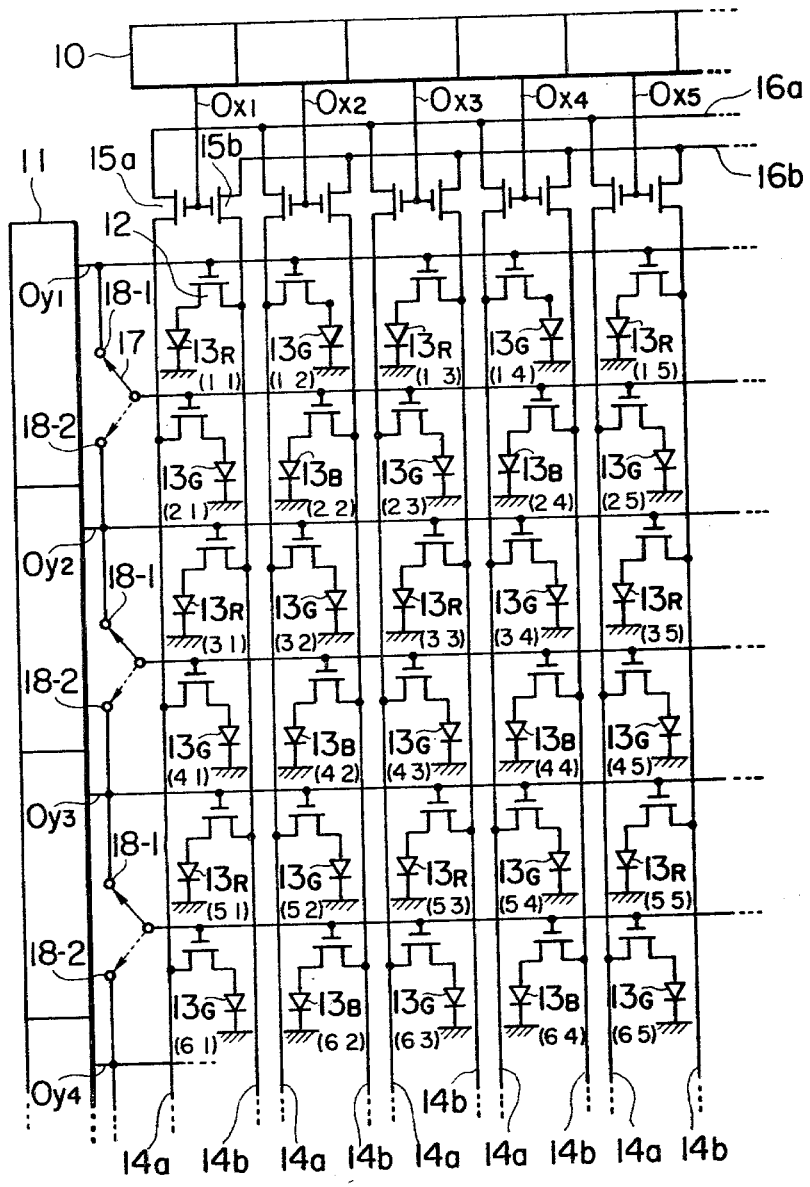
FIG. 3 is a circuit diagram showing an embodiment of the invention.
Figure 8:
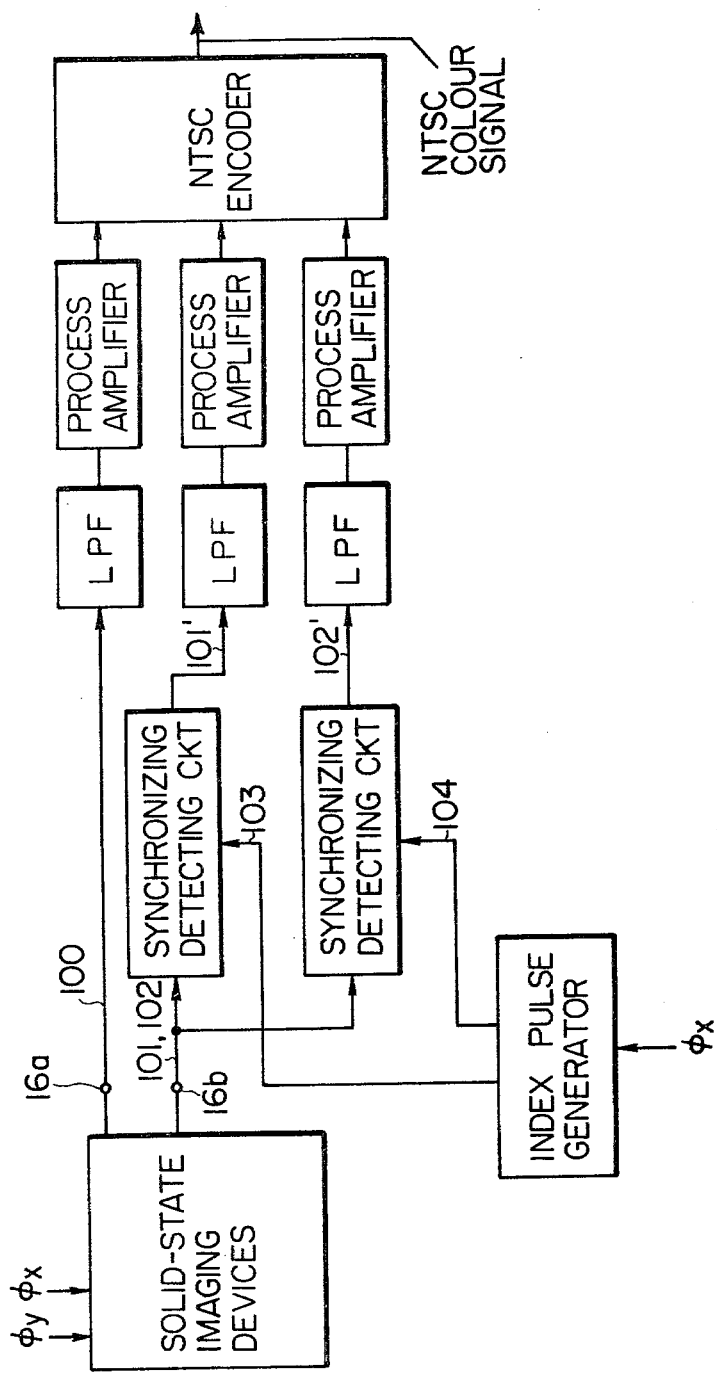
FIG. 8 is a block diagram of an output signal processing system in the invention.

FIG. 3 is a diagram showing the construction of an imaging plate which forms an essential part of the color solid-state imaging device according to the present invention. Numeral 10 designates a horizontal scanning circuit, and numeral 11 designates a vertical scanning circuit. Numeral 12 denotes a vertical switch (a vertical switch MOS transistor) which is turned "on" or "off" by a scanning pulse from the vertical scanning circuit. Numeral 13 indicates a photodiode (photoelectric conversion element) which exploits the source junction of the vertical switch 12. Although the various diodes 13 have the same structure, diode 13R serves to detect red light, diode 13G detects green light, and diode 13B detects blue light in accordance with the color filter assembly described previously (refer to FIG. 2). Where the diodes are to be made identical in this manner, all the diodes 13R, 13G, and 13B can be formed by the same manufacturing process, and hence, there is the advantage of easy fabrication. If the degree of complexity of the manufacturing process is not a problem, the diodes 13R, 13G, and 13B may be made different so as to have specific sensitivities to red light, green light, and blue light, respectively, in advance. Numerals 14a and 14b designate vertical signal output lines to which the drains of the vertical switches 12 are connected in common. Among the vertical signal output lines 14a, 14b, those designated by reference numeral 14a are signal output lines for green light which derive signals from diodes 13G, and those designated by reference numeral 14b are signal output lines for red light and blue light which derive signals from diodes 13R and 13B, respectively. Shown at 15a and 15b are horizontal switches (horizontal switch MOS transistors) which are turned "on" or "off" by scanning pulses from the horizontal scanning circuit 10. The horizontal switch 15a is a MOS transistor (hereinafter, abbreviated "MOST") which is connected to the vertical signal output line 14a at one end and to a horizontal signal output line 16a at the other end, while the horizontal switch 15b is a MOST which is connected to the vertical signal output line 14b at one end and to a horizontal signal output line 16b at the other end. Numeral 17 denotes an "interlace" switch for executing the interlaced scanning described previously. The "interlace" switches 17 are connected to terminals 18-1 or 18-2 with which scanning pulse output lines $0_{y1}$, $0_{y2}$, $0_{y3}$, $0_{y4}$ ... disposed at the respective stages of the vertical scanning circuit are provided. FIG. 7 is a diagram which shows the concrete construction of the change-over switch 17 in FIG. 3. The change-over switch 17 is constructed of a flip-flop circuit 19 and a MOST 20. An output of the flip-flop circuit 19 is switched at every field. FIG. 8 is a block diagram of an output signal processing system of the solid-state imaging device in FIG. 3.

Figure 4:
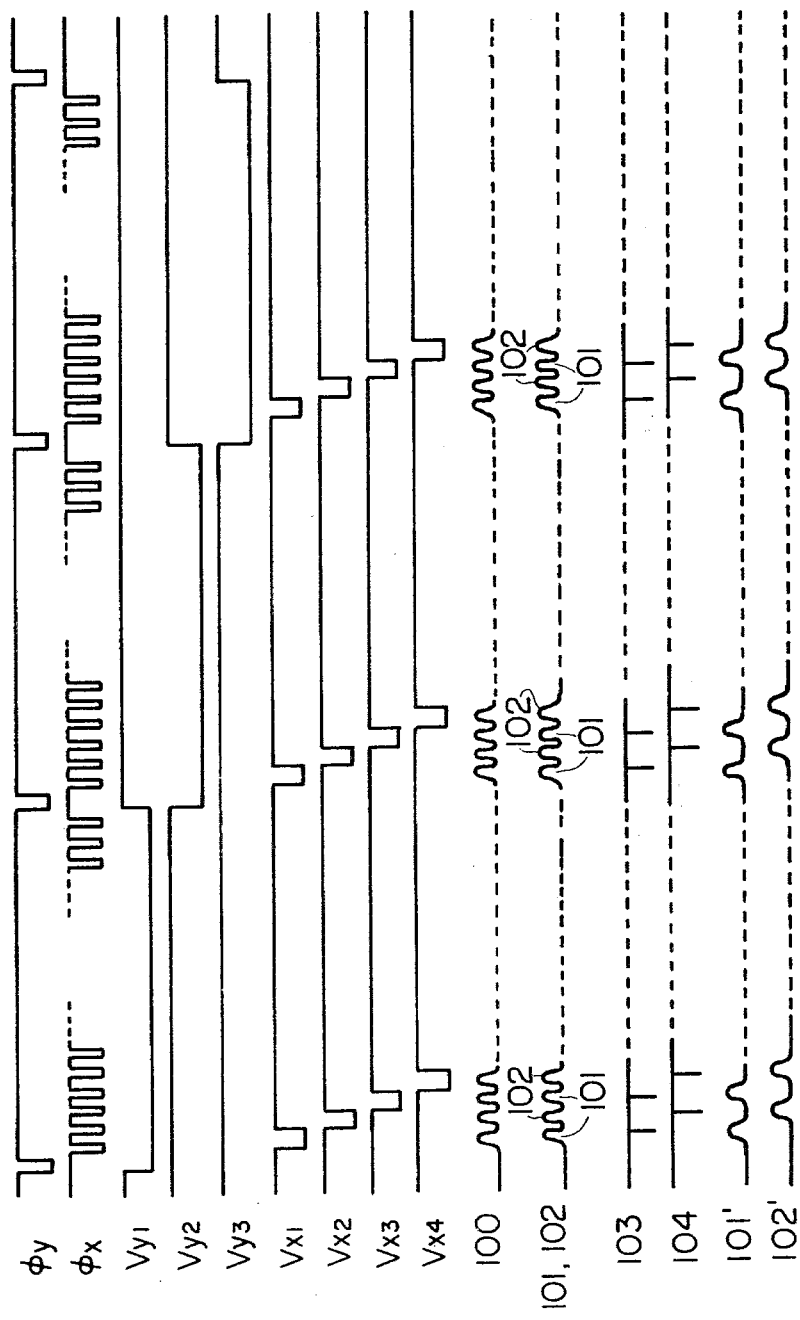
FIG. 4 is a waveform diagram for explaining the operation of the color solid-state imaging device shown in FIG. 3.

The operation of the solid-state imaging device shown in FIG. 3 will be explained with reference to the timing diagram shown in FIG. 4 and the block diagram of FIG. 8. (Here, assuming that the constituent elements are P-channel MOSTs, the timing diagram is illustrated with negative logic pulse waveforms. For N-channel MOSTs, the polarity is inverted.) $\phi_y$ and $\phi_x$ represent clock pulses which are used for driving the vertical scanning circuit 11 and the horizontal scanning circuit 10, respectively. Respective scanning pulse output lines $0_{y1}$, $0_{y2}$, $0_{y3}$, ... and $0_{yM}$, and $0_{x1}$, $0_{x2}$, $0_{x3}$, $0_{x4}$ ... and $0_{xN}$ provide vertical scanning pulses $V_{y1}$, $V_{y2}$, $V_{y3}$ ... and $V_{yM}$, and horizontal scanning pulses $V_{x1}$, $V_{x2}$, $V_{x3}$, $V_{x4}$ ... and $V_{xN}$ on the basis of the clock pulses.

First, let it be assumed that the "interlace" change-over switches 17 are connected to the terminals 18-1, this scanning state being made a first field. Diode groups at first and second rows [13R(1,1), 13G(1,2), 13R(1,3) ... 13G(1,N)] and [13G(2,1), 13B(2,2), 13G(2,3) ... 13B(2,N)] are selected by the scanning pulse $V_{y1}$ at the first stage of the vertical scanning circuit. The horizontal switches 15a and 15b are successively turned "on" and "off" by the scanning pulses $V_{x1}$, $V_{x2}$, $V_{x3}$ ... and $V_{xN}$. Signals 100, representative of green light from the diodes (2,1), (1,2), (2,3) ... are delivered to the signal output line 16a. On the other hand, signals 101, representing red light, and signals 102, representing blue light, are alternately delivered from the diodes (1,1), (2,2), (1,3) ... to the signal output line 16b. Subsequently, diode groups at third and fourth rows [13R(3,1), 13G(3,2), 13R(3,3), ... 13G(3,N)] and [13G(4,1), 13B(4,2), 13G(4,3) ... 13B(4,N)] are selected by the scanning pulse $V_{y2}$ at the second stage of the vertical scanning circuit. By the same operation as described above, the green representative signals 100 are delivered to the signal output line 16a, the red representative signals 101 and the blue representative signals 102 are alternately delivered to the signal output line 16b. The diodes at (M−1)-th and M-th rows are selected by a similar operation, and the scanning of the first field is completed. (Here, M is assumed to be an even number. Where M is an odd number, the diodes at (M−2)-th and (M−1)-th rows are selected.)

Next, the "interlace" change-over switches 17 are connected to the terminals 18-2, and the scanning of a second field is begun. In the second field, accordingly, the diodes at the second and third rows are selected by the vertical scanning pulse $V_{y2}$, and the diodes at the fourth and fifth rows are selected by the scanning pulse $V_{y3}$. The diodes at the (M−2)-th and (M−1)-th rows are selected in the final scanning of the second field. (M is assumed to be even. In case where M is odd, the diodes at the (M−1)-th and M-th rows are selected.) Also, in the second field, as in the case of the first field, the green representative signals 100 are delivered to the signal output line 16a, the representative signals 101 and the blue representative signals 102 are alternately delivered to the signal output line 16b. The scanning of one frame is completed through the first field and the second field, whereupon the first-field scanning of the next frame commences.

As illustrated in FIG. 8, the signals 101 and 102 obtained from the output line 16b are synchronously detected by means of synchronizing detection circuits by using index signals 103 and 104 which are produced by an index pulse generator circuit with reference to the horizontal clock pulses $\phi_x$. Thus, they are separated into red representative signals 101' and blue representative signals 102'. These red and blue representative signals and the green representative signals obtained from the output line 16a pass through low-pass filters (LPFs) and are thereafter waveshaped by three process amplifiers. Further, the waveshaped signals are sent to, for example, an NTSC (National Television System Committee) encoder so as to convert them into NTSC color signals.

Figure 5:
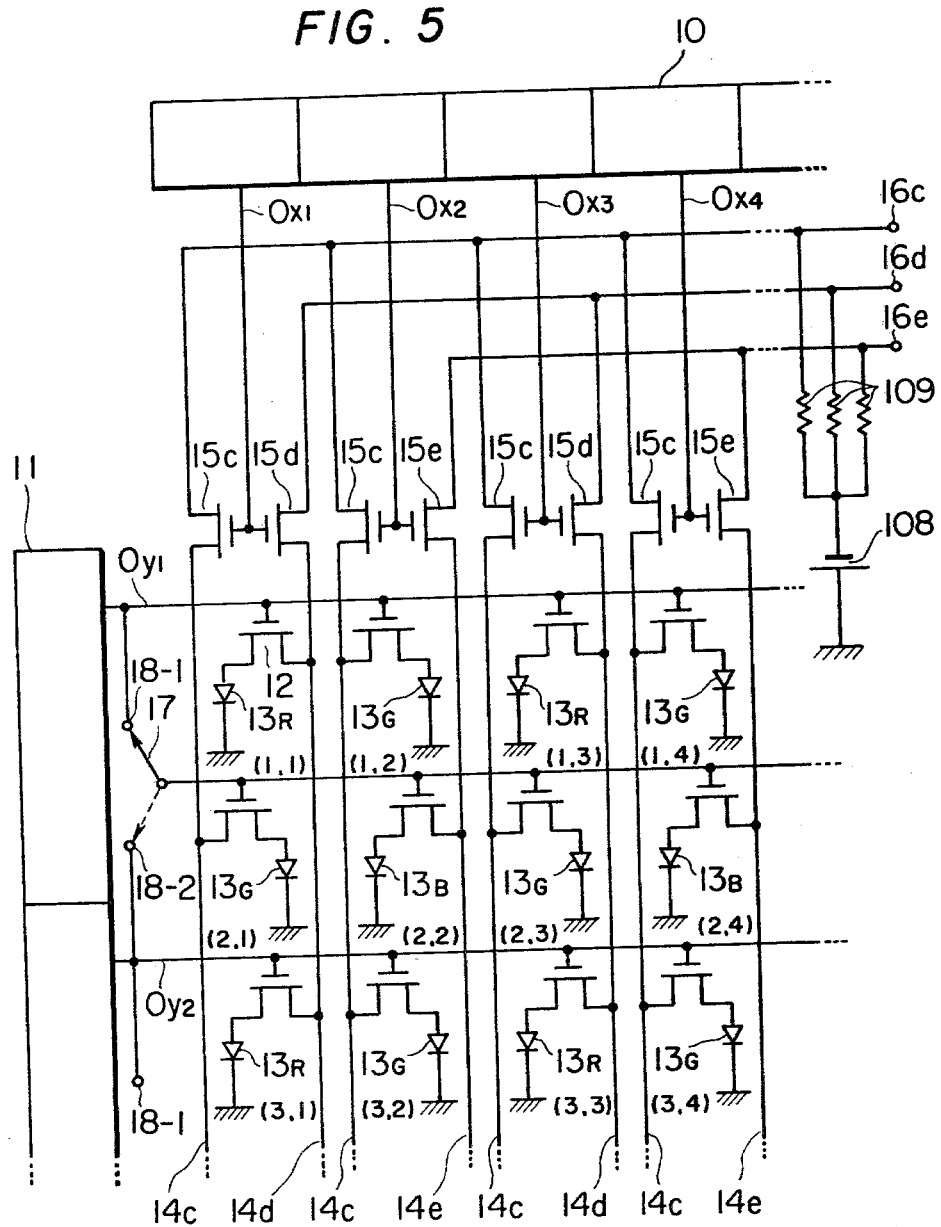
FIGS. 5 and 6 are circuit diagrams each showing the essential construction of another embodiment of the invention.

FIG. 5 shows another embodiment of the present invention. Numeral 15 (15c, 15d, 15e) designates a horizontal switch which is connected to a horizontal signal output line 16 (16c, 16d, 16e) at one end and to a vertical signal output line 14 (14c, 14d, 14e) at the other end. Numeral 108 designates a photoelectric conversion element-biasing power source which is connected to the horizontal signal output lines 16 through resistors 109. An operation similar to that explained in relation to FIG. 3 is carried out and the horizontal signal output line 16c serves as a green representative signal output line, line 16d serves as a red representative signal output line, and line 16e serves as a blue representative signal output line. In the case of the present construction, the number of signal output lines increases by one as compared with that in the embodiment of FIG. 3. Since, however, the red representative signals and the blue representative signals are derived by the individual output lines, the number of floating capacitances parasitic to the red and blue representative signal output lines are decreased by one-half in comparison with the corresponding floating capacitance in the embodiment of FIG. 3, and the signal read-out rate can be made high. A further advantage is that conversion into video signals is facilitated.

Figure 6:
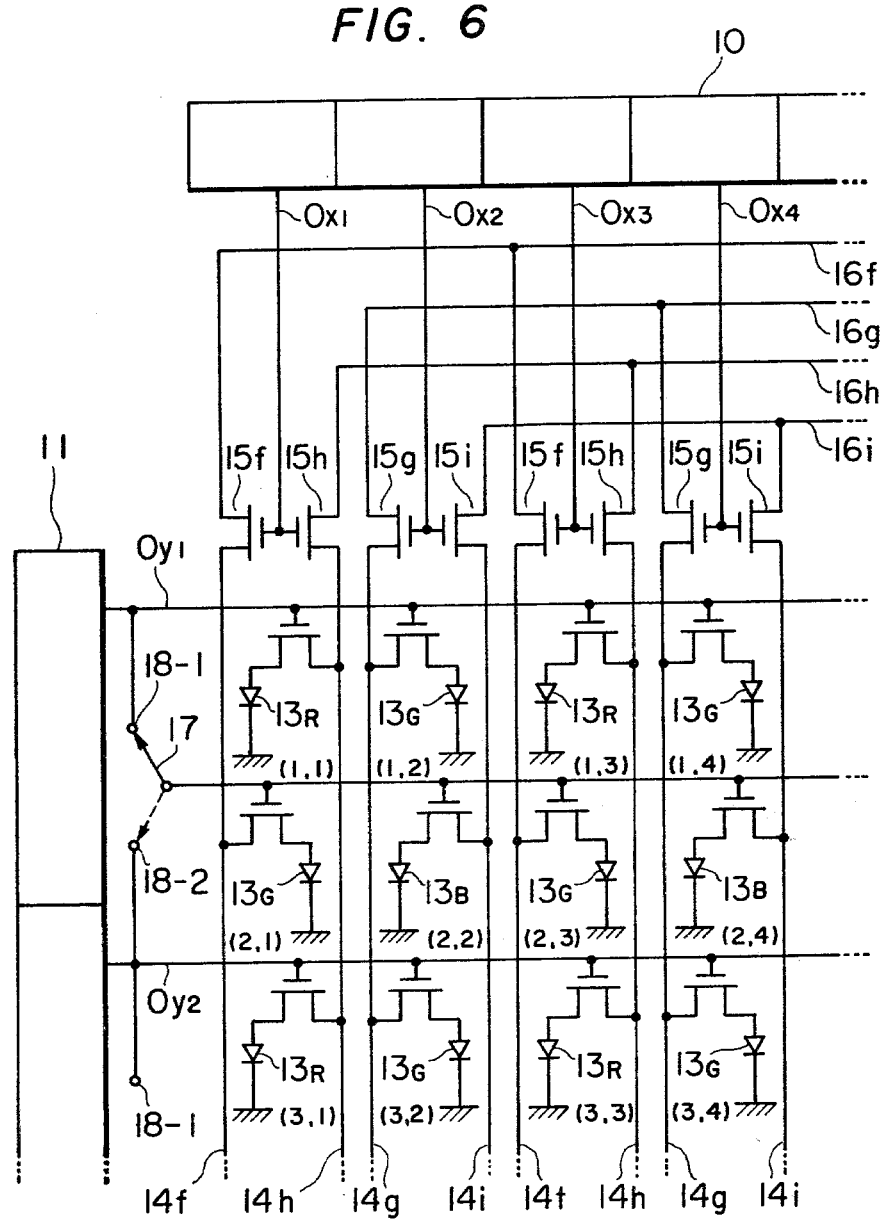

FIG. 6 shows still another embodiment of the present invention. Numeral 15 designates a horizontal switch which is connected to a horizontal signal output line 16 (16f, 16g, 16h, 16i) at one end and to a vertical signal output line 14 (14f, 14g, 14h, 14i) at the other end. Owing to an operation similar to that explained in relation to FIG. 3, the horizontal signal output lines 16f and 16g serve as green representative signal output lines, line 16h serves as a red representative signal output line, and line 16i serves as a blue representative signal output line. In accordance with the present construction, the number of signal output lines is further increased by one as compared with the embodiment of FIG. 5. However, the number of capacitances parasitic to the green representative signal output lines is decreased by one-half together with those parasitic to the red representative and blue representative signal output lines, which brings forth advantages that the signal read-out rate can be made high and that conversion into video signals is facilitated.

As described above in detail in conjunction with various embodiments of the solid-state imaging device of this invention, a plurality of signal output lines are provided and color signals corresponding to respective elements for the colors red, green, and blue are derived from the elements arranged in a checkered pattern, whereby a color solid-state imaging device which exhibits a high resolving power and which does not suffer a capacitance lag can be provided. The effects of the present invention are of great value in practical use.

Although MOS transistors have been referred to as the constituent elements in the foregoing description, it is needless to say that the present invention is also applicable to color solid-state imaging devices which include bipolar transistors, junction field-effect transistors, CCDs (charge coupled devices), etc., and any combination of these elements as the constituent elements thereof.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. A color solid-state imaging device comprising:
    a photoelectric conversion arrangement having a two-dimensional structure in which a first set of a plurality of photoelectric conversion elements for detecting respective lights of a first color and a second color which are arranged alternately in a vertical scanning direction, and a second set of a plurality of photoelectric conversion elements for detecting respective lights of said second color and a third color which are arranged alternately in a vertical scanning direction, with each of said sets being arranged alternately in a horizontal scanning direction,
    vertical switch means, disposed in correspondence with said photoelectric conversion elements arranged in two dimensions, for selecting said photoelectric conversion elements in response to vertical scanning pulses supplied thereto, outputs of said vertical switch means, which switch means are connected to the photoelectric conversion elements disposed in the respective first sets, being connected to respective vertical signal output lines provided in common for each of said first color and said second color, and outputs of said vertical switch means, which switch means are connected to the photoelectric conversion elements disposed in the respective second sets, being connected to respective vertical signal output lines provided in common for each of said second color and said third color,
    horizontal switches, disposed for the respective colors of said first color, said second color and said third color, turned "on" and "off" in response to horizontal scanning pulses supplied thereto,
    means for deriving photoelectric conversion output signals through said horizontal switches disposed for said respective colors, from said vertical signal output lines.

2. A color solid-state imaging device according to claim 1, wherein said photoelectric conversion arrangement comprises photodiodes employing the source junctions of switching MOS transistors.

3. A color solid-state imaging device according to claim 1, wherein said vertical scanning pulses are supplied from said vertical scanning circuit means for effecting interlaced scanning for reading out every two rows in said vertical direction on the basis of combinations different for respective scanning fields.

4. A color solid-state imaging device according to claim 3, wherein said means for deriving the photoelectric conversion output signals connected in common for said respective colors includes a signal output line for said first color, and a common signal output line for said second and third colors.

5. A color solid-state imaging device according to claim 3, wherein said means for deriving the photoelectric conversion output signals connected in common for said respective colors includes signal output lines for said respective colors.

6. A color solid-state imaging device according to claim 3, wherein said means for deriving the photoelectric conversion output signals connected in common for said respective colors includes one signal output line for each of two sets into which columns of said photoelectric conversion elements for said first color are divided, and one signal output line for each of the columns of said photoelectric conversion elements for said second color and columns of said photoelectric conversion elements for said third color.

7. A color solid-state imaging device according to claim 3, comprising color filters arranged in a checkered pattern which are placed over said respective photoelectric conversion elements in a one-to-one correspondence.

8. A color solid-state imaging device according to claim 7, wherein said means for deriving the photoelectric conversion output signals connected in common for said respective colors includes a signal output line for green light, and a common signal output line for red light and blue light.

9. A color solid-stage imaging device according to claim 7, wherein said means for deriving the photoelectric conversion output signals connected in common for said respective colors includes respective signal output lines for red, green, and blue light.

10. A color solid-state imaging device according to claim 7, wherein said means for deriving the photoelectric conversion output signals connected in common for said respective colors includes one signal output line for each of two sets into which the columns of said photoelectric conversion elements for green light are divided, and one signal output line for each of the columns of said photoelectric conversion elements for red light, and the columns of said photoelectric conversion elements for blue light.

11. A color solid-state imaging devices comprising;
a photoelectric conversion arrangement having a two-dimensional structure in which a first set of a plurality of photoelectric conversion elements for detecting respective lights of a plurality of different colors which set of conversion elements and their associated colors are regularly arranged in a certain order in a horizontal scanning direction, and a second set of a plurality of photoelectric conversion elements for detecting respective light of said colors which second set of conversion elements and their associated colors are regularly arranged in a certain order different from said first set in a horizontal scanning direction, with each of said sets being arranged alternately in a vertical scanning direction,
vertical switch means, disposed in correspondence with said photoelectric conversion elements arranged in two dimensions, for selecting said photoelectric conversion elements in response to vertical scanning pulses supplied thereto, outputs of said vertical switch means being connected to respective vertical signal output lines provided in common for each of said colors, said vertical scanning pulses being supplied from vertical scanning circuit means for effecting interlaced scanning for reading out every two rows in the vertical scanning direction on the basis of combinations different for respective scanning fields,
horizontal switches, disposed for the respective colors, turned "on" and "off" in response to horizontal scanning pulses supplied thereto
output means for deriving photoelectric conversion output signals through said horizontal switches disposed for said respective colors from said vertical signal output lines.

12. A color solid-state imaging device accoding to claim 11, wherein said output means includes signal output lines for said respective colors.

* * * * *